United States Patent [19]
Minear

[11] 3,943,415
[45] Mar. 9, 1976

[54] TIMING CIRCUIT
[76] Inventor: James P. Minear, 16705 Graham St., Huntington Beach, Calif. 92649
[22] Filed: Oct. 29, 1974
[21] Appl. No.: 518,707

[52] U.S. Cl. ............................ 317/141 S; 307/132 E
[51] Int. Cl.² .......................................... H03H 9/00
[58] Field of Search .............. 317/141 S; 307/132 E

[56] References Cited
UNITED STATES PATENTS
3,188,623   6/1965   Culbertson ..................... 307/132 E

*Primary Examiner*—R. N. Envall, Jr.
*Attorney, Agent, or Firm*—Edward D. O'Brian

[57] ABSTRACT

A timing circuit is disclosed which utilizes a principal transistor as a switch to control current flow through a load. The emitter and collector of this principal transistor are connected in a series with a load across DC terminals. Two control transistors are used to regulate when a current is passed by the principal transistor. The base of a first of these control transistors is connected between a resistor and a capacitor in an RC circuit which is connected so as to determine if a current is flowing in the first mentioned series circuit. The base of the other of the transistors is connected to the first mentioned series circuit through a resistor and a capacitor and is grounded through a resistor. As a result of charging of its associated capacitor and of feedback through this capacitor the first control transistor serves to render the principal transistor conductive after it has not conducted a current for a time interval determined by its associated resistor. The second control transistor serves to maintain the principal transistor conductive as its associated capacitor becomes charged and as the charge bleeds off of it.

9 Claims, 2 Drawing Figures

TIMING CIRCUIT

BACKGROUND OF THE INVENTION

The invention set forth in this specification pertains to new and improved timing circuits.

Many different timing circuits are of course known and utilized. It is not considered that an understanding of the present invention requires a detailed discussion of the most commonly known of such prior timing circuits. At the present time such timing circuits are normally constructed so as to utilize one or more transistors. They frequently employ one or more SCR's. They also employ various numbers of resistors and capacitors and frequently they also employ diodes.

In general such prior timing circuits have been comparatively complex and therefore comparatively expensive. In the electronic field this is quite important because cost considerations will mark the difference between a commercially salable product and a product which cannot be sold. Also many of such prior timing circuits have not been effective so as to supply a repetitive signal of a precise duration at precisely timed repetitive time periods to a load. Although many prior timing circuits can be used for this purpose, such prior circuits as have been used for this purpose are considered to have been unnecessarily complex and expensive and/or unsuitable in one manner or another for certain specific applications.

BRIEF SUMMARY OF THE INVENTION

An object of the present invention is to provide new and improved timing circuits. More specifically an objective of the invention is to provide timing circuits which are relatively inexpensive to construct and which are more desirable for certain types of applications than various different known timing circuits. An objective of the present invention is also to provide timing circuits which will supply repetitive signals of a precise duration at precisely timed repetitive periods to a load.

In accordance with this invention these various objectives are achieved in a timing circuit for use in aupplying electric current to a load, this current flowing between two terminals when it is supplied to the load by the improvement which comprises:

switch means for passing said current at repetitive periods, said switch means being connected in a series circuit with said load between said terminals, said switch means being capable of being electrically controlled, switch control means for use in controlling the operation of said switch means so as to permit a current to flow between said terminals at repetitive periods, said switch control means being connected to said switch means, first current flow responsive means for actuating said switch control means at a time interval after no current has flowed between said terminals so as to permit current to flow through said switch means, said first current flow responsive means being connected to said switch control means and being connected to said series circuit, said first current flow responsive means being capable of being actuated by current flowing between said terminals when current is not flowing in said series circuit, said first current flow responsive means being responsive to the flow of current in said series circuit so as to no longer actuate said switch control means to cause said switch control means to control said switch means so that said switch means passes a current, other current flow responsive means connected to said switch control means and to said series circuit for causing said switch control means to maintain said switch means capable of passing a current for a time interval after said switch means has commenced passing a current as the result of the action of said first current flow responsive means.

BRIEF DESCRIPTION OF THE DRAWING

The invention is best more fully explained with reference to the accompanying drawing in which.

These specific circuits embody certain essentially intangible concepts as are set forth and defined in the appended claims. It will be recognized that various modifications within the scope of routine skill in the electronic industry can be made in the circuits shown without departing from the scope of the invention as is set forth in these claims.

DETAILED DESCRIPTION OF THE PREFERRED EMBODIMENT

Figure 1:
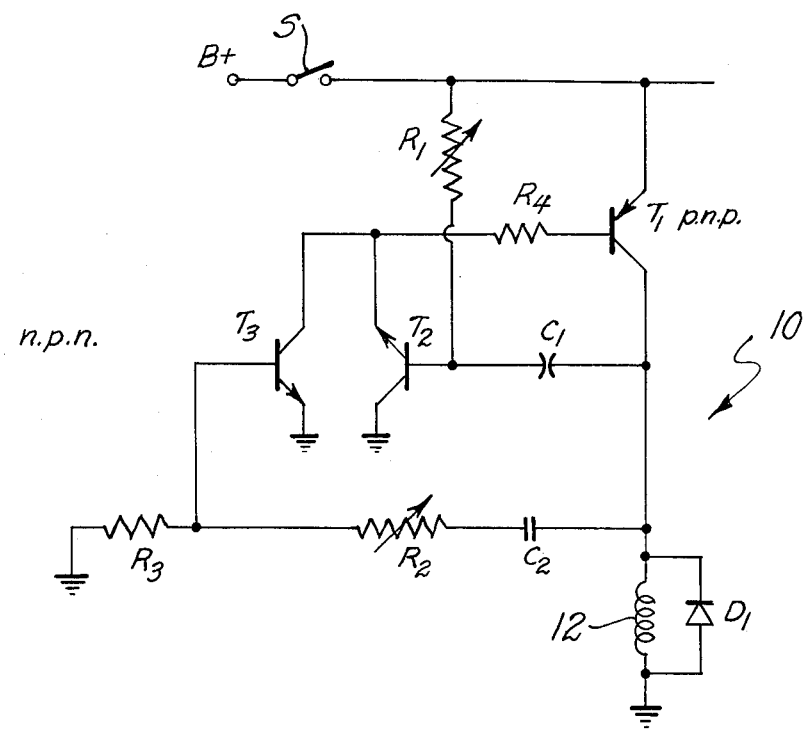
FIG. 1 is a schematic view showing a presently preferred timing circuit in accordance with the invention; and, FIG. 2 is a schematic view of a very closely related modified circuit in accordance with the invention.

In FIG. 1 of the drawing there is shown a circuit 10 in accordance with this invention which is used to supply a DC current to a solenoid coil 12 serving as a load connected between a conventional B+ terminal and a conventional ground terminal. The latter terminals are not specifically indicated by numerals herein because of the manner in which they are designated in the drawing. This load 12 is connected in series with the emitter and collector of a transistor used as a principal transistor in the circuit 10. This transistor in the circuit 10 is a pnp transistor which serves as an electronic switch or switch means to determine when current flows to the load 12.

The base of this transistor $T_1$ is connected to the emitter of a npn transistor $T_2$ through a small resistor $R_4$. The base of this transistor $T_1$ is also connected through the resistor $R_4$ to the collector of another npn transistor $T_3$. The emitter of this transistor $T_3$ is grounded; also the collector of this transistor $T_3$ is grounded. In effect the transistors $T_2$ and $T_3$ are connected in what can be regarded as a type of parallel circuit to the base of the transistor $T_1$ through the resistor $R_4$. Because of their functions as subsequently indicated, these two transistors $T_2$ and $T_3$ can be regarded collectively as a switch control means.

An R-C network or series circuit consisting of a resistor $R_1$ and a capacitor $C_1$ is connected around the emitter and collector of the transistor $T_1$ as shown as as to in effect serve as a type of bypass around this transistor $T_1$. The base of the transistor $T_2$ is connected between the resistor $R_1$ and the capacitor $C_1$ so that current within the R-C network will serve to regulate or control the operation of the transistor $T_2$. This R-C network consisting of $R_1$ and $C_1$ may be regarded as a first current flow responsive means because of its function as hereinafter indicated.

The circuit 10 also includes a second R-C network consisting of a capacitor $C_2$ connected in series with a resistor $R_2$ to the base of the transistor $T_3$. Because of its function this second R-C network may be regarded as a second current flow responsive means. It will be noted that the capacitor $C_2$ is connected so that one of its terminals is connected to $R_2$ and so that the other of its terminals is connected between the collector of transistor $T_1$ and the load 12. The base of the transistor $T_3$ is grounded through another resistor $R_3$.

During the use of the circuit 10 when a switch S associated with the B+ power supply is closed current will not pass the transistor $T_1$ but will flow through the resistor $R_1$ so as to charge the capacitor $C_1$. As this capacitor $C_1$ becomes charged the charge on it will, of course, be conveyed to the base of the transistor $T_2$, turning this transistor $T_2$ on. The transistor $T_2$ will then pass current through $R_4$ to the base of the transistor $T_1$, turning this transistor $T_1$ on. As it becomes conductive a current will flow from B+ power supply through the load 12 to ground.

As the current initially flows in this manner there will be a feedback of the current to the capacitor $C_1$ from the collector of the transistor $T_1$. As this occurs the capacitor $C_2$ will become charged as the result of the current flow through $T_1$. This charge on the capacitor $C_2$ will operate through the resistor $R_2$ on the base of the transistor $T_3$, rendering this transistor $T_3$ conductive. For an interval both the transistors $T_2$ and $T_3$ will supply currents to the base of the transistor $T_1$ so as to maintain this transistor $T_1$ conductive. However, the amount of time when such current is supplied to the base of transistor $T_1$ by the transistor $T_2$ will be limited to a comparatively short interval.

This is because there will be a feedback from the current passed by the transistor $T_1$ to the capacitor $C_1$ which will act in opposition to the current originally serving to charge the capacitor $C_1$. The capacitor $C_1$ reaches a neutral state as the result of this feedback and the connected base of the transistor $T_2$ will be affected so that this transistor $T_2$ no longer supplies a current to the base of transistor $T_1$. However, when $T_2$ no longer supplies a current to the base of transistor $T_1$ transistor $T_3$ will continue to be operative to supply a current to the base of transistor $T_1$ until such time as the charge on capacitor $C_2$ will be gradually bled off to ground through the resistors $R_2$ and $R_3$. At this point transistor $T_3$ will be turned off and the cycle of operation will begin again.

In order to achieve the mode of operation indicated the capacitor $C_2$ should have a smaller capacitance than the capacitor $C_1$. Preferably the resistors $R_1$ and $R_2$ are variable resistors as shown so that they may be used to regulate the on and off times of the transistor $T_1$. The resistor $R_1$ serves to regulate the time interval or period during which no current will flow through transistor $T_1$ as a result of its action in regulating the charging rate of the capacitor $C_1$. The resistors $R_2$ and $R_3$ similarly serve to regulate the length of the time interval when the transistor $T_1$ is conductive.

It will be apparent from the aforegoing that a number of different changes can be made in the circuit 10 without altering the essential character of this circuit. As an example of this the resistor $R_4$ described in the preceding serves to limit the base current to the transistor $T_1$ so as to prevent this transistor $T_1$ from burning out. Under certain circumstances it is considered that this resistor $R_4$ can be eliminated. In the circuit 10 a diode $D_1$ is located in parallel around the load 12 so as to protect the transistor $T_1$ from being subjected to a back voltage when current ceases to flow in the coil of load 12. Other similar loads can be powered using the circuit 10 and with certain of them the diode $D_1$ will not be required.

Figure 2:
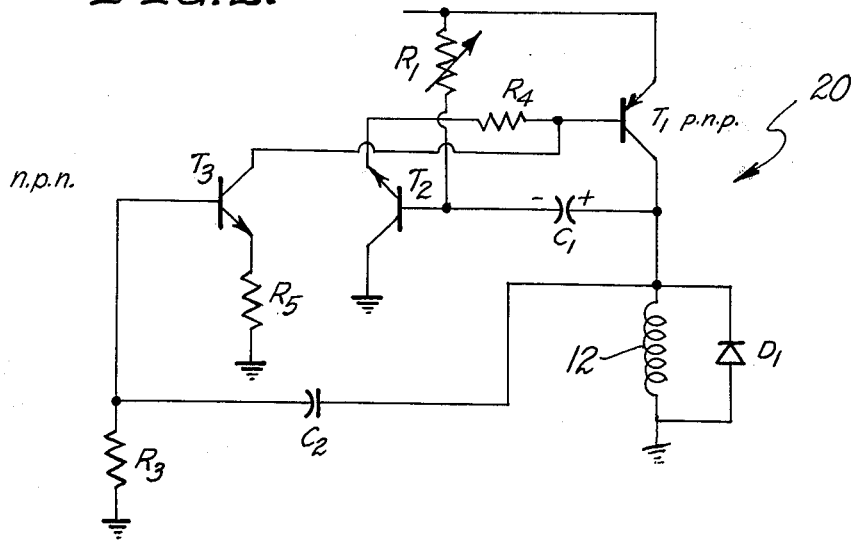

Another modification of the circuit 10 is shown in FIG. 2. Here there is shown a circuit 20 which is substantially identical to the circuit 10 except in several minor respects. In the interest of brevity corresponding points of the circuits 10 and 20 are designated as in the preceding and are not separately described herein. The manner of operation of the circuit 20 is substantially identical with the manner of operation of the circuit 10. In the circuit 20 the previously described resistor $R_2$ is omitted and another resistor $R_5$ is connected between the emitter of the transistor $T_3$ and ground. This change alters the operation of the transistor $T_3$ so that it operates as an emitter-follower. This eliminates the effect of the emitter-input resistance as the transistor $T_3$ operates. In the circuit 20 the on time during which the transistor $T_1$ is conductive is determined by what may be regarded as an RC network consisting of the capacitor $C_2$ and the Resistor $R_3$.

The circuits 10 and 20 illustrated are considered to be effective, relatively inexpensive circuits for certain intended uses and are considered to be much more desirable for such usages than other prior related circuits. If desired these circuits 10 and 20 can be cascaded in accordance with conventional practice so as to obtain virtually any desired on or off periods.

I claim:

1. A timing circuit for use in supplying an electric current to a load, said current flowing between two terminals when it is supplied to said load in which the improvement comprises:

switch means for passing said current at repetitive periods, said switch means being connected in a series circuit with said load between said terminals, said switch means being capable of being electrically controlled, switch control means for use in controlling the operation of said switch means so as to permit a current to flow between said terminals as repetitive periods, said switch control means being connected to said switch means, first current flow responsive means for actuating said switch control means at a time interval after no current has flowed between said terminals so as to permit current to flow through said switch means, said first current flow responsive means being connected to said switch control means and being connected to said series circuit, said first current flow responsive means being capable of being actuated by current flowing between said terminals when current is not flowing in said series circuit, said first current flow responsive means being responsive to the flow of current in said series circuit so as to no longer actuate said switch control means to cause said switch control means to control said switch means so that said switch means passes a current, other current flow responsive means connected to said switch control means and to said series circuit for causing said switch control means to maintain said switch means capable of passing a current for a time interval after said switch means has commenced passing a current as the result of the action of said first current flow responsive means.

2. A timing circuit as claimed in claim 1 wherein: said switch means is a transistor and said switch control means are two transistors, one of which is connected to said first current flow responsive means and the other of which is connected to said other current flow responsive means.

3. A timing circuit as claimed in claim 1 wherein:
said first current flow responsive means comprises an R-C network consisting of a resistor and a capacitor, said switch control means being connected to said network between said resistor and said capacitor.

4. A timing circuit as claimed in claim 3 wherein said resistor is a variable resistor.

5. A timing circuit as claimed in claim 1 wherein:
said other current flow responsive means includes a capacitor, said capacitor being connected to said series circuit and to said switch control means, and a resistor connected to said capacitor permitting said capacitor to be gradually discharged.

6. A timing circuit as claimed in claim 5 wherein:
said resistor is a variable resistor.

7. A timing circuit as claimed in claim 1 wherein:
said switch means is a principal transistor,
said switch control means comprise two control transistors,
said first current flow responsive means comprises a first R-C network consisting of a resistor and a capacitor connected in series, said first R-C network being connected between the emitter and collector of said first transistor, the base of one of said control transistors being connected to said R-C network between said resistor and said capacitor,
said other current flow responsive means includes another capacitor, said capacitor being connected to the base of the other of said control transistors and another resistor connected to said other capacitor and said base of the other of said control transistors so as to permit said other capacitor to be gradually discharged.

8. A timing circuit as claimed in claim 7 wherein:
said other current flow responsive means includes a second resistor connected between said other capacitor and said base of the other of said control transistors.

9. A timing circuit as claimed in claim 8 wherein:
said resistor of said first current flow responsive means and said second resistor of said other current flow responsive means are variable resistors.

* * * * *